(12) United States Patent
Bankaitis et al.

(10) Patent No.: US 8,377,825 B2
(45) Date of Patent: Feb. 19, 2013

(54) SEMICONDUCTOR WAFER RE-USE USING CHEMICAL MECHANICAL POLISHING

(75) Inventors: Jonas Bankaitis, Horseheads, NY (US); Michael John Moore, Corning, NY (US)

(73) Assignee: Corning Incorporated, Corning, NY (US)

( * ) Notice: Subject to any disclaimer, the term of this patent is extended or adjusted under 35 U.S.C. 154(b) by 553 days.

(21) Appl. No.: 12/609,768

(22) Filed: Oct. 30, 2009

(65) Prior Publication Data

US 2011/0104994 A1 May 5, 2011

(51) Int. Cl.
*H01L 21/302* (2006.01)

(52) U.S. Cl. ........ 438/692; 438/690; 438/691; 438/974; 216/83; 216/88; 216/89; 216/90; 216/91; 257/E21.561

(58) Field of Classification Search .................. None
See application file for complete search history.

(56) References Cited

U.S. PATENT DOCUMENTS

| | | | |
|---|---|---|---|
| 6,234,877 B1 * | 5/2001 | Koos et al. | 451/41 |
| 6,294,472 B1 * | 9/2001 | Smith et al. | 438/693 |
| 6,887,136 B2 | 5/2005 | Smith et al. | 451/57 |
| 6,984,164 B2 | 1/2006 | Kimura et al. | 451/8 |
| 7,176,528 B2 | 2/2007 | Couillard et al. | 257/347 |
| 7,226,864 B2 | 6/2007 | Koyata et al. | 438/690 |
| 7,267,784 B2 | 9/2007 | Fang et al. | 252/79.1 |
| 7,510,974 B2 | 3/2009 | Li et al. | 438/692 |
| 2003/0017784 A1 | 1/2003 | Wang et al. | 451/41 |
| 2005/0112893 A1 | 5/2005 | Koyata et al. | 438/692 |
| 2005/0186891 A1 | 8/2005 | Benner | 451/56 |
| 2006/0024915 A1 | 2/2006 | Kobayashi | 438/455 |
| 2006/0252267 A1 * | 11/2006 | Wang et al. | 438/692 |
| 2007/0048968 A1 | 3/2007 | Couillard et al. | 438/455 |
| 2007/0264796 A1 * | 11/2007 | Stocker | 438/455 |
| 2009/0061593 A1 | 3/2009 | Gadkaree et al. | 438/458 |

FOREIGN PATENT DOCUMENTS

| EP | 1566830 A1 | 8/2005 |
|---|---|---|
| WO | WO2009/029264 A1 | 3/2009 |

OTHER PUBLICATIONS

S. Wolf, Silicon Processing for the VLSI Era, vol. 4, 2002, pp. 339-340.*

* cited by examiner

*Primary Examiner* — Lan Vinh
*Assistant Examiner* — Jiong-Ping Lu
(74) *Attorney, Agent, or Firm* — Bruce P. Watson; Gibson & Dernier LLP (57) ABSTRACT

Methods and apparatus for reducing damage of a semiconductor donor wafer include the steps of: (a) rotating a polishing pad, rotating the semiconductor donor wafer, applying a polishing slurry to the polishing pad, and pressing the semiconductor donor wafer and the polishing pad together; and (b) rotating the polishing pad and the semiconductor donor wafer, discontinuing the application of the polishing slurry, applying a rinsing fluid to the polishing pad, and pressing the semiconductor donor wafer and the polishing pad together, wherein step (a) followed by step (b) is carried out in sequence at least two times, and at least one of the following are reduced in at least two successive intervals of step (a): (i) a pressure at which the semiconductor donor wafer and the polishing pad are pressed together, (ii) a mean particle size of an abrasive within the polishing slurry, and (iii) a concentration of the slurry in water and stabilizers.

14 Claims, 9 Drawing Sheets

| P1 | P2 | P3 | P4 | P5 | P6 | P7 | P8 | P9 |
|---|---|---|---|---|---|---|---|---|
| 18 | 1  | 0 | 6 | 375 | 60 | 30 | 200 | SUBA 1200 |
| 9  | 2  | 1 | 4 | 250 | 30 | 45 | 0   | SUBA 1200 |
| 16 | 3  | 1 | 8 | 500 | 90 | 45 | 400 | SUBA 1200 |
| 15 | 4  | 1 | 4 | 500 | 90 | 45 | 0   | SUBA 1200 |
| 5  | 5  | 1 | 4 | 250 | 30 | 15 | 400 | SUBA 1200 |
| 4  | 6  | 1 | 8 | 500 | 30 | 15 | 0   | SUBA 1200 |
| 3  | 7  | 1 | 4 | 500 | 30 | 15 | 400 | SUBA 1200 |
| 10 | 8  | 1 | 8 | 250 | 90 | 45 | 400 | SUBA 1200 |
| 6  | 9  | 1 | 8 | 250 | 60 | 15 | 0   | SUBA 1200 |
| 20 | 10 | 0 | 6 | 375 | 90 | 30 | 200 | SUBA 500 |
| 19 | 11 | 0 | 6 | 375 | 60 | 30 | 200 | SUBA 500 |
| 13 | 12 | 1 | 4 | 250 | 30 | 45 | 400 | SUBA 500 |
| 8  | 13 | 1 | 8 | 500 | 90 | 15 | 400 | SUBA 500 |
| 1  | 14 | 1 | 4 | 250 | 30 | 15 | 0   | SUBA 500 |
| 2  | 15 | 1 | 8 | 250 | 30 | 15 | 400 | SUBA 500 |
| 11 | 16 | 1 | 4 | 500 | 30 | 45 | 400 | SUBA 500 |
| 12 | 17 | 1 | 8 | 500 | 30 | 45 | 0   | SUBA 500 |
| 14 | 18 | 1 | 8 | 250 | 90 | 45 | 0   | SUBA 500 |
| 7  | 19 | 1 | 4 | 500 | 90 | 15 | 0   | SUBA 500 |
| 17 | 20 | 0 | 6 | 375 | 60 | 30 | 200 | SUBA 500 |

SEMICONDUCTOR WAFER RE-USE USING CHEMICAL MECHANICAL POLISHING

BACKGROUND

The present invention relates to the manufacture of semiconductor-on-insulator (SOI) structures using an improved process for making same.

To date, the semiconductor material most commonly used in semiconductor-on-insulator structures has been silicon. Such structures have been referred to in the literature as silicon-on-insulator structures and the abbreviation "SOI" has been applied to such structures. SOI technology is becoming increasingly important for high performance thin film transistors, solar cells, and displays, such as active matrix displays. SOI structures may include a thin layer of substantially single crystal silicon on an insulating material.

Various ways of obtaining SOI structures include epitaxial growth of silicon (Si) on lattice matched substrates. An alternative process includes the bonding of a single crystal silicon wafer to another silicon wafer on which an oxide layer of $SiO_2$ has been grown, followed by polishing or etching of the top wafer down to, for example, a 0.05 to 0.3 micron layer of single crystal silicon. Further methods include ion-implantation methods in which either hydrogen or oxygen ions are implanted either to form a buried oxide layer in the silicon wafer topped by Si, in the case of oxygen ion implantation, or to separate (exfoliate) a thin Si layer to bond to another Si wafer with an oxide layer, as in the case of hydrogen ion implantation.

Manufacture of SOI structures by these methods is costly. The latter method involving hydrogen ion implantation has received some attention and has been considered advantageous over the former methods because the implantation energies required are less than 50% of that of oxygen ion implants and the dosage required is two orders of magnitude lower.

U.S. Pat. No. 7,176,528 discloses anodic bonding processes that produce SOI structures. The steps include: (i) exposing a silicon wafer surface to hydrogen ion implantation to create a bonding surface; (ii) bringing the bonding surface of the wafer into contact with a glass substrate; (iii) temperature and voltage to the wafer and the glass substrate to facilitate bonding therebetween (pressure may also be applied); (iv) cooling the structure to a common temperature; and (v) separating the glass substrate and a thin layer of silicon from the silicon wafer.

After the removal of a first thin layer of silicon (or other semiconductor material) from the donor semiconductor wafer in the SOI process, which may remove less than one micron, about 95% or more of the donor semiconductor wafer may still be available for further use. The re-use of a donor semiconductor wafer has a relatively significant impact on the cost to produce an SOI structure, particularly a large area SOI structure. Donor semiconductor wafer re-use—which may be a dominant factor impacting the process cost—defines how many times a given donor semiconductor wafer can be used during numerous bonding processes to produce SOI structure(s). The re-use factor is even more important when a large area SOI is being produced using separate semiconductor layer structures laterally disposed over a given glass substrate (so-called tiling). For such processes, it is desirable to re-use a given donor semiconductor wafer as many times as possible.

For re-use it is necessary to return a bonding surface of the donor semiconductor wafer to a relatively damage-free state—at least to a state indistinguishable from an un-used (prime surface) of a donor wafer. This has been done by removing a certain thickness of the donor semiconductor wafer, which is contaminated with ions and damaged due to the implantation and exfoliation (separation) processes, by conventional chemical mechanical polishing (CMP) techniques. While CMP techniques are well documented and existing equipment may be readily obtained, there are a number of problems with the existing CMP technology in the context of semiconductor re-use in anodic bonding/exfoliation processes.

Conventional CMP techniques are expensive because, in the case of semiconductor re-use, multiple equipment set-ups are required. A given CMP set-up includes a rotating polishing pad (having certain abrasive characteristics), a slurry (also having certain abrasive characteristics), and a rotating chuck or head to press the semiconductor wafer against the polishing pad and slurry. In accordance with conventional CMP techniques, in order to obtain a semiconductor wafer with satisfactory surface characteristics in a re-use context, multiple polishing pads are needed (see, for example, U.S. Pat. No. 7,510,974). This requires either manual process steps to change the polishing pad on a given piece of equipment, or multiple pieces of equipment, each with a different polishing pad. Either approach adds cost to the manufacturing process and adversely impacts the commercial viability of the SOI structure and end-use application.

Existing CMP polishing protocols call for aggressive removal of material, which increases the risk of depleting the thickness budget for each re-use cycle, and thus increases the risk of missing re-use cost objectives. Concurrently, such aggressive protocols increase the risk of breakage due to associated handling of much thinner (and likely more fragile) wafers.

The conventional CMP protocols do not remove material uniformly across the surface of the donor semiconductor wafer. The state of the art for round semiconductor wafer surface non-uniformities (standard deviation/mean removal thickness) is typically 5-10% of the material thickness removed. As more of the semiconductor material is removed, the variation in the thickness correspondingly worsens. A related problem with conventional CMP processes is that they exhibit particularly poor results when non-round semiconductor wafers (e.g., those having sharp corners, such as rectangular wafers) are polished. Indeed, the aforementioned surface non-uniformities are amplified at the corners of the donor semiconductor wafer compared with those at the center thereof. Multiple re-use of the donor semiconductor wafer by such CMP protocols results in the premature end to a given wafer's re-use life because the surface geometry (e.g., near the corners) exceeds re-use functional limits.

For example, if 0.150 microns of actual damage needs to be removed from a bonding surface of a donor semiconductor wafer, then to be certain that the damaged and contaminated layer has been completely removed from the whole surface (taking into account the aforementioned non-uniform characteristics of the CMP protocols), at least 1.0 micron may be the target thickness for removal. Thus, over five times the thickness of the actual damage is removed in order to be sure that all the damage is removed. This is highly wasteful and has significant, negative cost implications.

Although the manufacturing processes for making SOI structures are maturing, the cost of producing such structures and the final products employing them is driven in part by the ability to use (and re-use) donor semiconductor wafers efficiently. Accordingly, it is desirable to continue to advance the technologies associated with re-using donor semiconductor wafers, such as CMP, in order to control the cost of manufacturing SOI structures.

SUMMARY

For ease of presentation, the following discussion will at times be in terms of SOI structures. The references to this particular type of SOI structure are made to facilitate the explanation of the embodiments herein and are not intended to, and should not be interpreted in a limiting sense. The SOI abbreviation is used herein to refer to semiconductor-on-insulator structures in general, including, but not limited to, semiconductor-on-glass (SOG) structures, silicon-on-insulator (SOI) structures, and silicon-on-glass (SiOG) structures, which also encompasses silicon-on-glass-ceramic structures.

Embodiments of the donor semiconductor wafer re-use process described herein solve the problems with the conventional CMP techniques, such as repeatability, reliability and cost in connection with restoring donor semiconductor wafer surfaces (even of non-round, arbitrary geometry) for the purpose of producing multiple high quality semiconductor films from a given donor semiconductor wafer.

It has been discovered that donor semiconductor wafer re-use as described above may be successfully implemented using CMP methodology if specific combinations of the CMP process parameters are established and/or varied. These parameters may include one or more of: polishing down force, polisher kinematics (e.g., platen and head speeds), process temperature, slurry characteristics (e.g., concentration, particle size, additives, and flow rate), polishing pad, method of restraining the polishing substrate, and cycle duration. Importantly, it has been demonstrated that such a CMP process may be implemented on existing polisher equipped with only one polishing platform and pad, thereby foregoing the need to acquire expensive, complex silicon polishing technology and related equipment.

In this regard, embodiments described herein are directed to: removal of substantially all surface damage from the surface of interest incurred in previous ion implantation/exfoliation cycles; restoration of the surface of interest such that a semiconductor film produced therefrom cannot be distinguished from that of a pristine, prime semiconductor surface; control of material removal with each re-use resurfacing cycle to achieve a high number of re-uses and resultant cost efficiencies; uniform removal of material across the surface of interest, particularly on rectangular donor semiconductor wafer geometries; and achieving one or more (preferably all) of the above using a single polishing platform and pad.

One or more embodiments disclosed herein may include the application of CMP methodology to a donor semiconductor wafer of arbitrary geometry (round, non-round, rectangular, etc.) to enable restoration of a surface previously exposed to ion implantation/exfoliation, thereby enabling repeated uses of the donor wafer in subsequent ion implantation/exfoliation processing. The CMP process employs three basic elements: a polishing pad in which the characteristics thereof (abrasiveness, composition, etc.) are selected to suit the polishing application; a particle-laden slurry (also application specific and suited to the choice of polishing medium); and the subject to be polished (in this context, a donor semiconductor wafer). The donor wafer is affixed to a chuck or head in such a way as to allow controlled pressing of a damaged surface thereof against the compliant polishing pad, which has been saturated with, and continuously fed by, a steady supply of the slurry. Substrate topography is reduced and global planarity established by simultaneous interfacial chemical and mechanical interactions which may be controlled by strategic choice of such consumables as polishing pad, slurry particle properties and associated chemistry including additives. Selection of the polishing pad, slurry particle chemistry, slurry concentration, slurry flow rate, slurry additives, polishing down force and kinematics, temperature, polishing duration, and method of restraining the polishing substrate are used in particular combinations to control material removal and effect surface restoration.

One or more embodiments feature a sequence of process steps in which polishing down force, slurry concentration, and slurry particle size are strategically decremented in steps separated by high volume deionized water rinses—all using a single polishing pad.

In accordance with one or more embodiments disclosed herein, methods and apparatus for reducing surface damage of a semiconductor donor wafer include: (a) rotating a polishing pad, rotating the semiconductor donor wafer, applying a polishing slurry to the polishing pad, and pressing the semiconductor donor wafer and the polishing pad together; and (b) rotating the polishing pad and the semiconductor donor wafer, discontinuing the application of the polishing slurry, applying a rinsing fluid to the polishing pad, and pressing the semiconductor donor wafer and the polishing pad together. Step (a) followed by step (b) is carried out in sequence at least two times, and at least one of the following are reduced in at least two successive intervals of step (a): (i) a pressure at which the semiconductor donor wafer and the polishing pad are pressed together, (ii) a mean particle size of an abrasive within the polishing slurry, and (iii) a concentration of the slurry in water and stabilizers.

Other aspects, features, advantages, etc. will become apparent to one skilled in the art when the description of the embodiments herein is taken in conjunction with the accompanying drawings.

BRIEF DESCRIPTION OF THE DRAWINGS

For the purposes of illustrating the various aspects of the embodiments herein, there are shown in the drawings forms that are presently preferred, it being understood, however, that the invention is not limited to the precise arrangements and instrumentalities shown.

DETAILED DESCRIPTION

Figure 1:
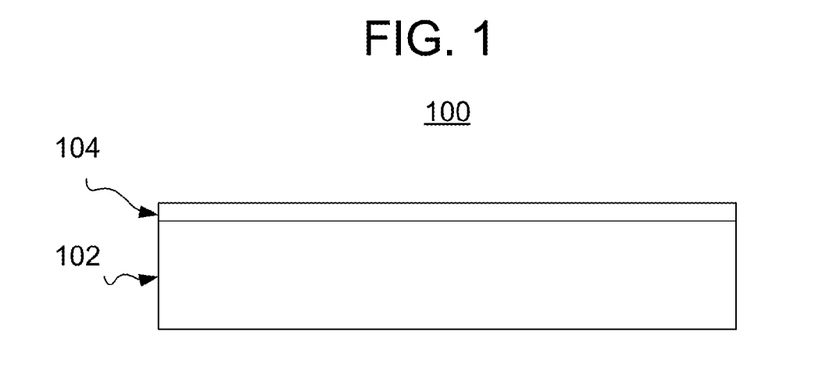
FIG. 1 is a simplified side view illustrating the structure of an SOG device in accordance with one or more embodiments described herein.

With reference to the drawings, wherein like numerals indicate like elements, there is shown in FIG. 1 an SOI structure (in particular, an SOG structure) 100 in accordance with one or more embodiments described herein. The SOG structure 100 includes an insulator substrate, such as a glass or glass ceramic substrate 102, and a semiconductor layer 104. The SOG structure 100 has application for use in displays, including organic light-emitting diode (OLED) displays and liquid crystal displays (LCDs), integrated circuits, photovoltaic devices, thin film transistor applications, etc.

The semiconductor material of the layer 104 may be in the form of a substantially single-crystal material. The term "substantially" is used in describing the layer 104 to take account of the fact that semiconductor materials normally contain at least some internal or surface defects either inherently or purposely added, such as lattice defects or a few grain boundaries. The term substantially also reflects the fact that certain dopants may distort or otherwise affect the crystal structure of the semiconductor material.

For the purposes of discussion, it is assumed that the semiconductor layer 104 is formed from silicon. It is understood, however, that the semiconductor material may be a silicon-based semiconductor or any other type of semiconductor, such as, the III-V, II-IV, II-IV-V, etc. classes of semiconductors. Examples of these materials include: silicon (Si), germanium-doped silicon (SiGe), silicon carbide (SiC), germanium (Ge), gallium arsenide (GaAs), GaP, and InP.

Figure 2:
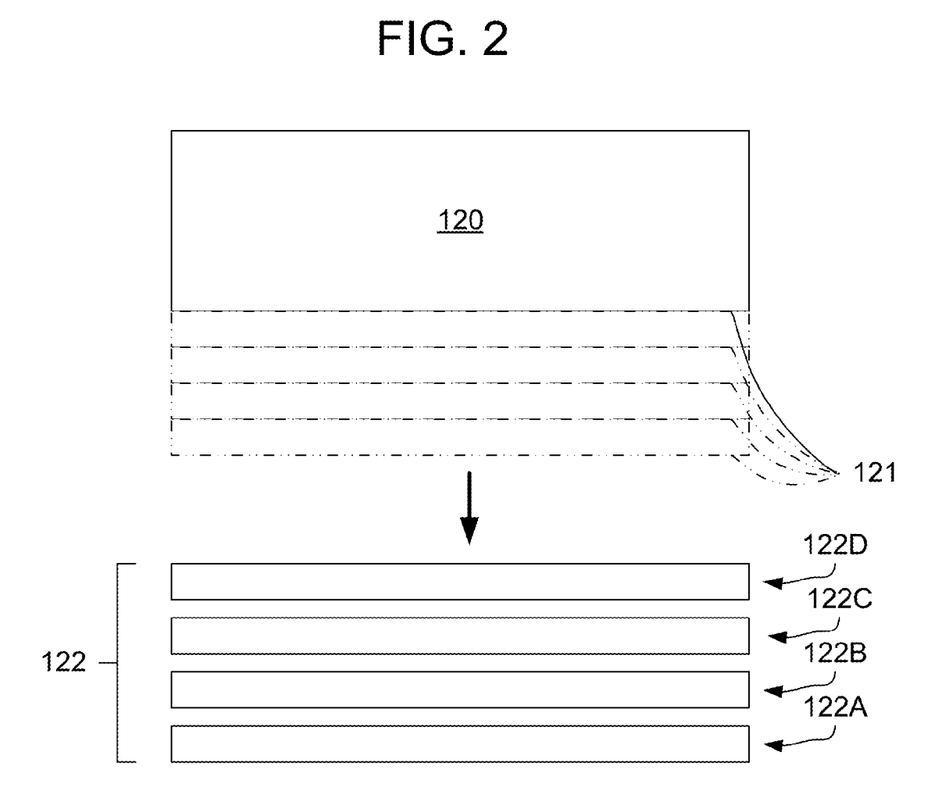
FIG. 2 is a simplified diagram illustrating the re-use of a donor semiconductor wafer used to form a number of the SOG devices of FIG. 1 in accordance with one or more embodiments herein.

With reference to FIG. 2, it is desirable to form many such SOG structures 100 in a manufacturing process, either for separate products, or for an integrated device in which multiple SOG structures are needed. In either case, one way to produce multiple SOG structures 100 is to cleave (separate or exfoliate) a number of thin exfoliation layers 122A, 122B, 122C, etc. of semiconductor material from a donor semiconductor wafer 120 during a process in which the respective bonding surfaces 121 of the donor semiconductor wafer 120 are bonded to respective glass substrates 102. After the removal (e.g. exfoliation, cleaving or separation) of a first exfoliation layer 122A of semiconductor material from the donor semiconductor wafer 120, a significant amount of the donor semiconductor wafer 120 (possibly 95% or more) is still available for further use. The re-use of a donor semiconductor wafer 120 has a relatively significant impact on the cost to produce a number of SOG structures 100, particularly large area SOG structures. As will be discussed in more detail later herein, it is necessary to return a cleaved, exfoliated surface (and underlying damaged, contaminated layer) 121A of the remaining portion of the donor semiconductor wafer 120 to a subsequent, suitable bonding surface 121, having a relatively ion contamination and damage-free state. The subsequent bonding surface 121 is then used for a subsequent bonding and exfoliation process for the transfer and bonding of a second exfoliation layer 122B to a second glass substrate 102. In order to maximize the output from each donor semiconductor wafer 120, this "re-use" or "refresh" of the donor semiconductor wafer 120 is repeated as many times as possible by refinishing the cleaved surface 121A of the donor semiconductor wafer 120 for the transfer and bonding of second, third, fourth exfoliation layers 122B, 122C, 122D, etc. to respective glass substrates 102. The specific techniques used to refinish the cleaved surface (and underlying layer) 121A and make it ready for bonding and exfoliation may also have a significant impact on the overall cost to produce the SOG structures 100. These techniques will be described in more detail later herein.

Figure 3:
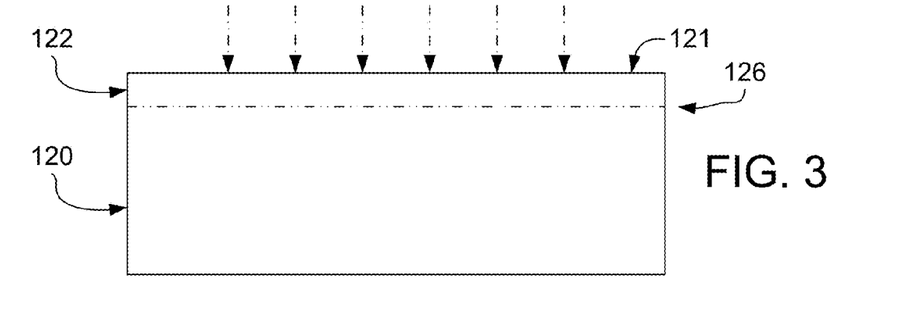
FIGS. 3-5 are simplified schematic diagrams illustrating intermediate structures formed using processes described herein to produce the SOG device of FIG. 1.
Figure 4:
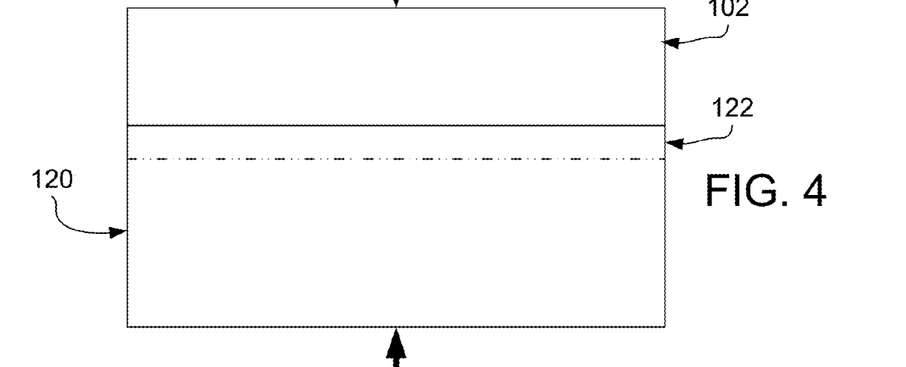
Figure 5:
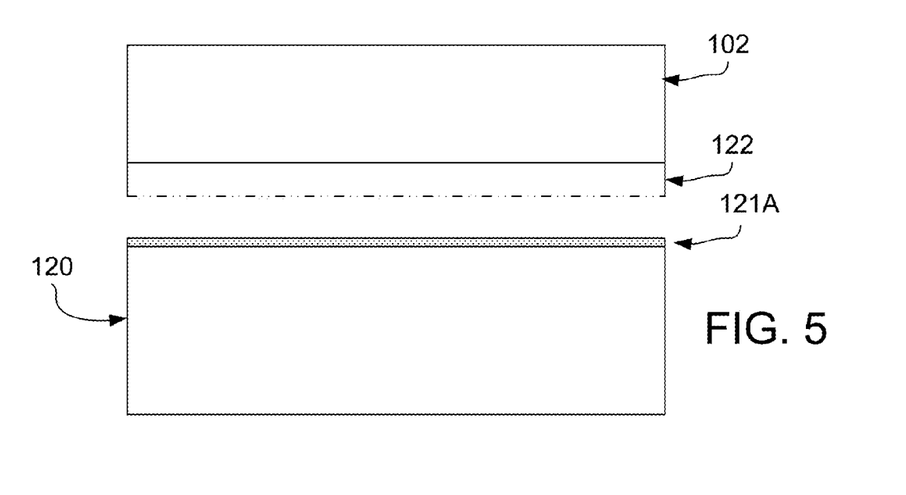

Reference is now made to FIGS. 3-5, which illustrate intermediate structures that may be formed in order to produce the SOG structure 100. Turning first to FIG. 3, the bonding surface 121 of the donor semiconductor wafer 120 is prepared, such as by polishing, cleaning, etc. to produce a relatively flat and uniform bonding surface 121 suitable for bonding to the glass or glass-ceramic substrate 102. For the purposes of discussion, the semiconductor wafer 120 may be a substantially single crystal silicon wafer, although as discussed above any other suitable semiconductor material may be employed.

An exfoliation layer 122 is created by subjecting the bonding surface 121 to one or more ion implantation processes to create a weakened region (diagrammatically illustrate by dashed line 126) below the bonding surface 121 of the donor semiconductor wafer 120. Although the embodiments described herein are not limited to any particular method of forming the exfoliation layer 122, one suitable method dictates that the bonding surface 121 of the donor semiconductor wafer 120 may be subject to a hydrogen ion implantation process to at least initiate the creation of the weakened region 126 in the donor semiconductor wafer 120. The implantation energy may be adjusted using conventional techniques to achieve a general thickness of the exfoliation layer 122, such as between about 300-500 nm. By way of example, hydrogen ion implantation may be employed, although other ions or multiples thereof may be employed, such as boron+hydrogen, helium+hydrogen, or other ions known in the literature for exfoliation. Again, any other known or hereinafter developed technique suitable for forming the exfoliation layer 122 may be employed.

Regardless of the nature of the implanted ion species, the effect of implantation of ions into the weakened region 126 is the displacement of atoms in the crystal lattice from their regular locations. When the atom in the lattice is hit by an ion, the atom is forced out of position and a primary defect, a vacancy and an interstitial atom, is created, which is called a Frenkel pair. If the implantation is performed near room temperature, the components of the primary defect move and create many types of secondary defects, such as vacancy clusters, etc.

With reference to FIG. 4, the glass substrate 102 may be bonded to the bonding surface 121 of exfoliation layer 122 using any known or hereinafter developed technology. For example, the glass substrate 102 may be bonded to the exfoliation layer 122 using a thermal bonding process. Alternatively, the glass substrate 102 may be bonded to the exfoliation layer 122 using an electrolysis process (also referred to herein as an anodic bonding process). A basis for a suitable electrolysis bonding process may be found in U.S. Pat. No. 7,176,528, the entire disclosure of which is hereby incorporated by reference. Portions of this process are discussed below.

In an anodic bonding process, appropriate surface cleaning of the glass substrate 102 (and the exfoliation layer 122 if not done already) may be carried out. Thereafter, the intermediate structures are brought into direct or indirect contact to achieve the arrangement schematically illustrated in FIG. 4. The resulting intermediate structure is thus a stack, including the bulk material layer of the donor semiconductor wafer 120, the exfoliation layer 122, and the glass substrate 102.

Prior to or after the contact, the structure(s) comprising the donor semiconductor wafer 120, the exfoliation layer 122, and the glass substrate 102 are heated. The glass substrate 102 may be heated to a higher temperature than the donor semiconductor wafer 120 and exfoliation layer 122.

The glass substrate 102 and the donor semiconductor wafer 120 may be taken to a temperature within about +/−150 degrees C. of the strain point of the glass substrate 102.

Next, a voltage is applied across the intermediate assembly, for example with the donor semiconductor wafer 120 at the positive electrode and the glass substrate 102 the negative electrode. Pressure may also be applied to press the donor semiconductor wafer 120 against the glass substrate 102. The intermediate assembly is held under the above conditions for some time (e.g., approximately 1 hour or less), the voltage is removed and the intermediate assembly is allowed to cool to room temperature.

With reference to FIG. 5, prior to, during and/or after cooling the donor semiconductor wafer 120 and the glass substrate 102 are separated, which may include some peeling if they have not already become completely free, to obtain a glass substrate 102 with the relatively thin exfoliation layer 122 formed of the semiconductor material of the donor semiconductor layer 120 bonded thereto. The separation of the exfoliation layer 122 may be accomplished via fracture of the donor semiconductor wafer 120 along the weakened region 126 due to thermal and internal pressure stresses. Alternatively or in addition, mechanical stresses or energy, such as water jet pressure or cutting (or other mechanical contact or cutting forces), tension or shear forces, or chemical etching may be used to initiate and/or facilitate the separation of the exfoliation layer 122 from the donor semiconductor wafer 120.

Figure 6A:
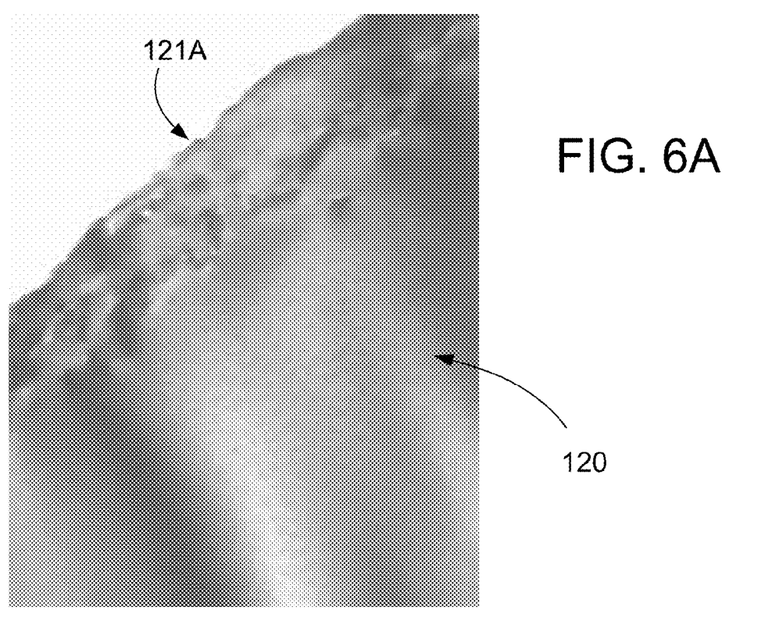
FIG. 6A illustrates the depth of damage of a surface of a donor semiconductor wafer that has been subjected to ion implantation/exfoliation.
Figure 6B:
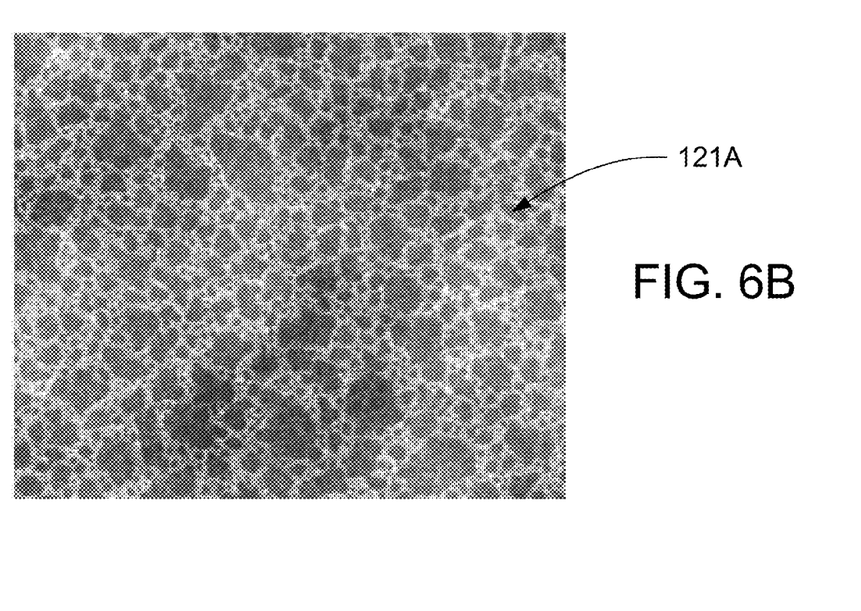
FIG. 6B illustrates the surface roughness and morphology characteristics of a surface of a donor semiconductor wafer that has been subjected to ion implantation/exfoliation.

The newly exposed cleaved surface (and underlying layer) 121A of the donor semiconductor wafer 120 may exhibit ion contamination and excessive surface roughness or damage from the implantation and exfoliation processes. By way of example, cleaved surface and underlying layer 121A in FIGS. 5 and 6A illustrate the depth of damage and ion contamination of the donor semiconductor wafer 120, which may be 200 nm or more. FIG. 6B illustrates the surface roughness and morphology characteristics of the cleaved surface 121A of the donor semiconductor wafer 120.

In accordance with one or more embodiments herein, the cleaved surface (and underlying layer) 121A of the donor semiconductor wafer 120 is subject to one or more CMP processing cycles over time to remove the damaged and ion contamination and produce a refreshed bonding surface 121 (FIG. 2) suitable for producing a further SOG structure 100. It is contemplated that the steps of creating an exfoliation layer 122, bonding the exfoliation layer 122 to a substrate 102, separating the exfoliation layer 122, and subsequent bonding surface refresh treatment—to repair the cleaved surface (and underlying layer) 121A of the donor semiconductor wafer 120—are repeated numerous times to utilize significant portions of the donor semiconductor wafer 120 to create respective exfoliation layers 122A, 122B, 122C. etc., thereby reducing material costs.

Figure 7:
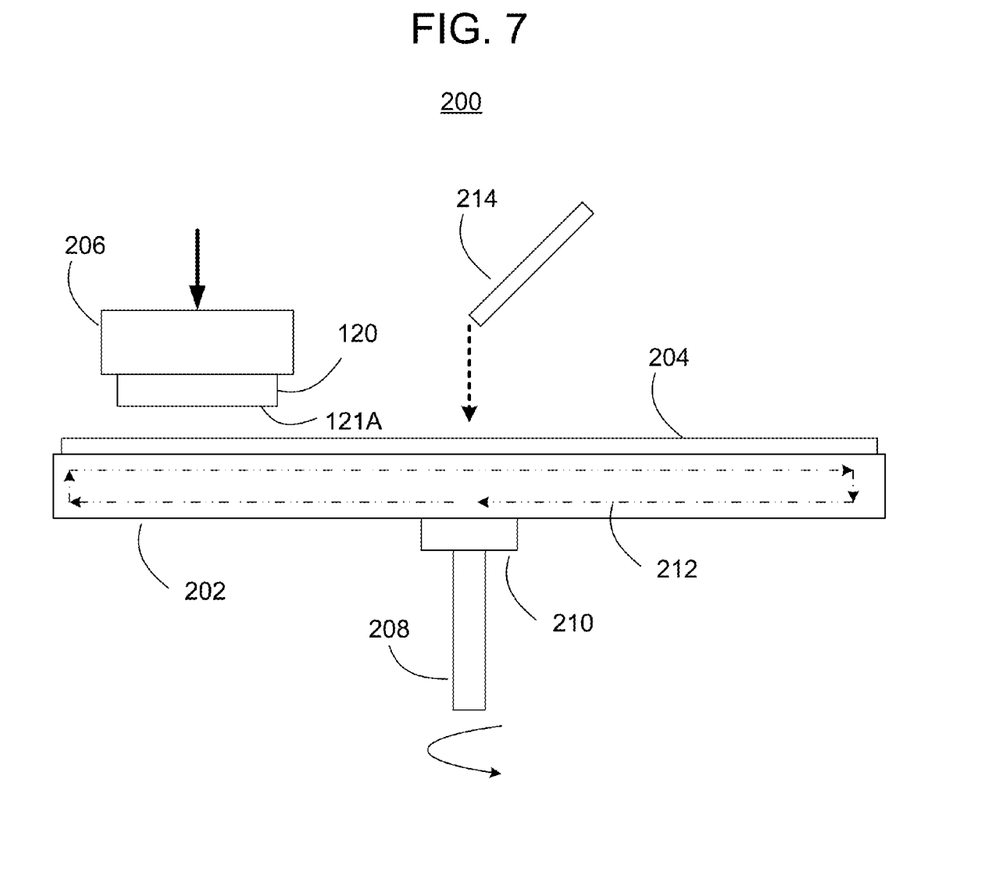
FIG. 7 is a schematic diagram of a piece of equipment suitable for carrying out CMP processes in accordance with one or more embodiments described herein.

With reference to FIG. 7, a suitable system 200 is illustrated for carrying out CMP processing embodiments to remove the damaged cleaved surface (and underlying layer) 121A from the donor semiconductor wafer 120. The system includes a polishing platen 202, a polishing pad 204, and a chuck or head 206. The polishing platen 202 rotates at a controlled rate in response to a shaft 208 and rotary union 210. A suitable controllable source of rotational drive (not shown) provides the required rotational torque to the shaft 208. The polishing platen 202 may contain an internal webbing or channels through which a heating/cooling fluid 212 may flow. For example, tempered water may flow at considerable volume (about 10-20 liters per minute) through the webbing in the platen. The temperature of the water may be controlled (such as to about 26° C.), such that a maximum polishing temperature may be maintained (such as not to exceed about 39° C.) at the surface of the polishing pad 204. The temperature of the surface of the polishing pad 204 may be measured via an optical pyrometer (not shown) trained thereon throughout the polishing process.

The polishing pad 204 may be of any suitable construction, although it has been discovered that advantages may be achieved when it includes certain characteristics that will be discussed later herein. A source 214 of delivering a slurry to the polishing pad 204 is strategically located to deliver adjustable rates thereof. As will be discussed in more detail below, a rinsing liquid (such as deionized water) may also delivered through the source 214, or through a separate independent source (not shown), to the polishing pad 204.

Figure 8:
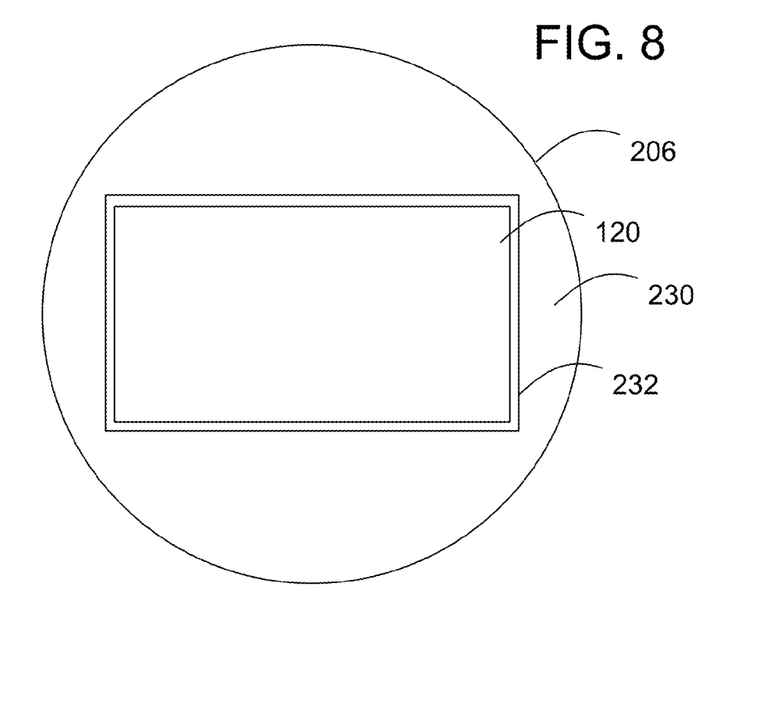
FIG. 8 is a schematic diagram showing some characteristics of a chuck or head for holding the semiconductor donor wafer in the equipment of FIG. 7 and in connection with one or more embodiments described herein.

The donor semiconductor wafer 120 is held by the chuck or head 206 and is pressed thereby against the polishing pad 204 during operation of the equipment 200. The head 206 may also rotate via appropriate motor and linkage (not shown). As shown in FIG. 8, the donor semiconductor wafer 120 may be of rectangular cross-section. The head 206 may include a rigid block 230 to which a composite material template 232 is mounted. The composite material template 232 may include a capillary-action pad bottom layer (e.g., a suede-based finish) and a plastic or fiberglass top layer. The form factor of the donor semiconductor wafer 120 (e.g. a rectangular relief) is machined through the top layer exposing the bottom layer. By way of example, the material template 232 may feature a 15-inch diameter, 0.170-inch nominal thickness disc into which a rectangular pocket with corner relief has been machined through the top layer. By way of example, the disc may be a material obtained from Franklin Fibre-Lamitex Corporation, such as a two-layer material with a capillary action bottom layer and a plastic or fiberglass top layer. The construction of the material template 232 may be such that the recessed area is formed in a size and shape corresponding closely to the donor semiconductor wafer 120 when the two composite layers are joined with one another. When the recessed area of the material template 232 is wetted with clean deionized water thereby wetting the capillary action bottom layer, and the backside of the donor semiconductor wafer 120 is gently pressed into the recess against the wet bottom layer. Capillary action holds the wafer 120 vertically in place in the recessed area in the direction that the wafer 120 and the polishing pad 204 are pressed together. The sides of the recessed area in the upper layer serve to restrain the donor semiconductor wafer 120 laterally in the axis of rotation.

In order to achieve desirable results, including proper surface roughness, proper uniformity, proper material removal, and low cost (in the context of donor semiconductor wafer re-use in an exfoliation process), it is critical that the CMP process be carefully controlled and that processing parameters be carefully selected. This is not a matter of routine optimization of parameters and predictable results. Rather, it has been discovered through painstaking experimentation and statistical analysis that certain processing parameters should be maintained and others varied in a cyclical process.

In view of the above, the equipment 200 was employed in a series of experiments to determine proper cyclical parameters. CMP process parameters that have been found to influence the planarity, surface quality, and material removal rate of the donor semiconductor wafer 120 include polishing down force (a pressure at which the semiconductor donor wafer 120 and the polishing pad 204 are pressed together), flow rates and types of slurry components, kinematics (polisher platen 202 and head 206 rotational speeds as well as relative directions), diluent flow rate, process temperature control, duration of polishing, selection of polishing pad 204 type, and method of wafer 120 mounting and restraint during polishing.

In the context of the re-use of a donor semiconductor wafer 120 having been subjected to ion implantation and exfoliation, process variables were tested by application of a statistically designed experimentation methodology. A broad screening of experiments were carried out in which six (6) treatment effects influential in material removal and surface quality were evaluated over wide ranges. Per "design of experiments" (DOE) statistical methodology, a highly fractionated matrix of process parameters were tested. Specifically, two blocks of experiments were run with two different pad types, augmented with strategically placed center points. The experiments were designed to isolate those polishing process parameters that most influenced material removal and surface roughness, two responses believed crucial to successful semiconductor refresh processing. The matrix of process parameters are illustrated in FIG. 10, where the parameters are labeled P1 for standard order, P2 for run order, P3 for center point, P4 for down force (psi), P5 for slurry flow rate (ml/min), P6 for platen speed (rpm), P7 for head speed (rpm), P8 for DI water flow rate (ml/min), and P9 for pad type.

Figure 10:
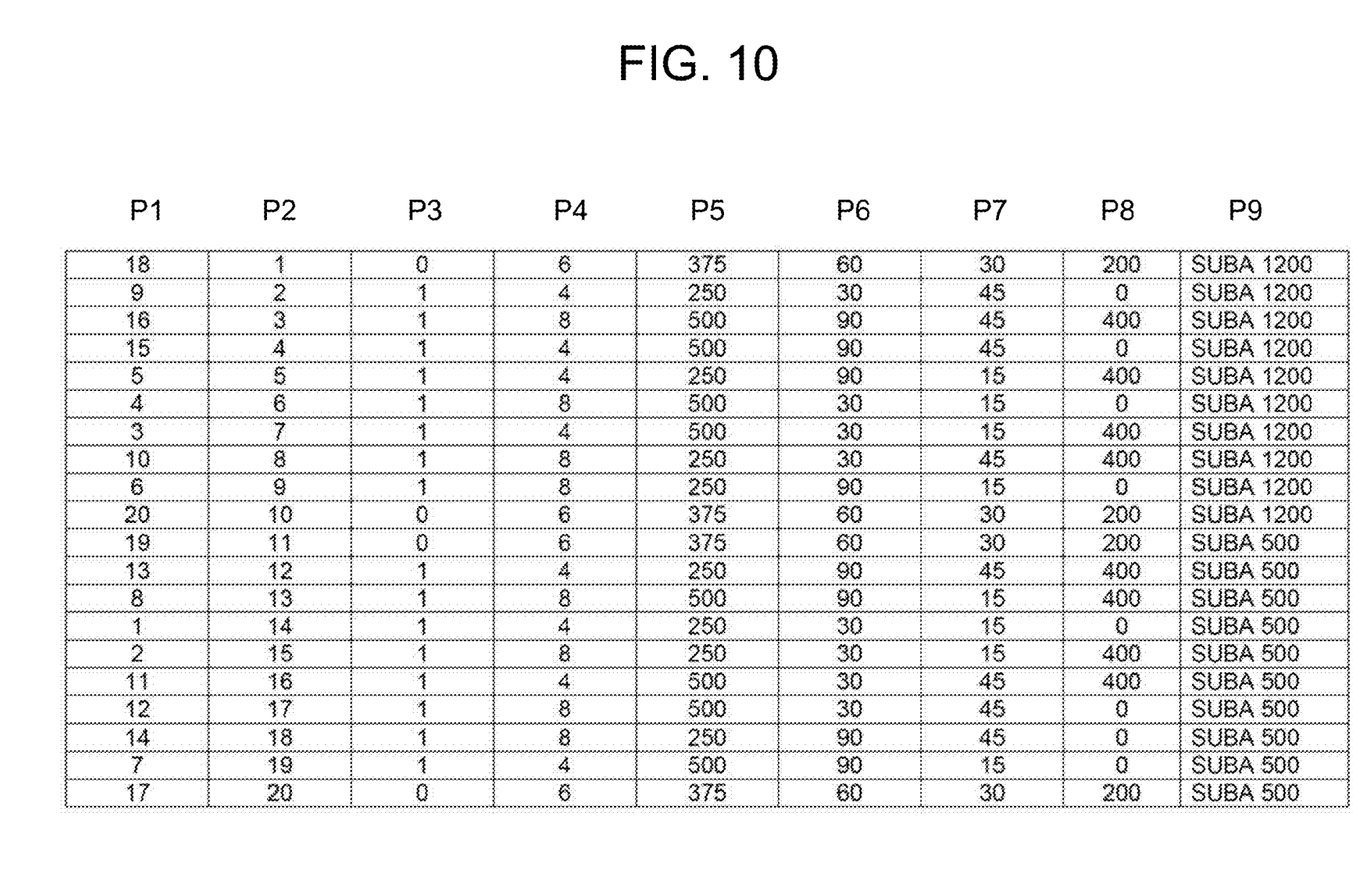
FIG. 10 is a table illustrating a matrix of process parameters used during experimentation to identify important processing variables most influential to material removal and surface roughness.
Figure 11A:
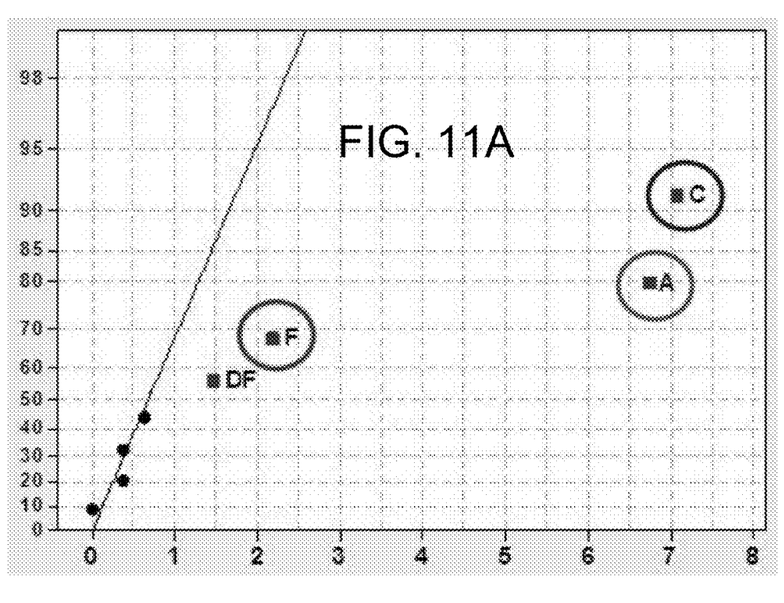
FIG. 11A is a graph illustrating the statistical results of the experiments conducted in connection with the parameters of FIG. 10 as relate to material removal.
Figure 11B:
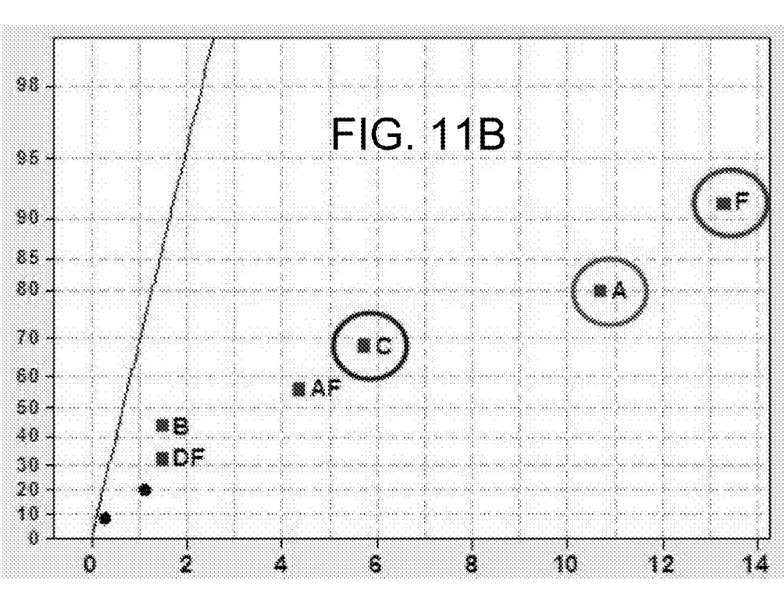
FIG. 11B is a graph illustrating the statistical results of the experiments conducted in connection with the parameters of FIG. 10 as relate to surface roughness.

Statistical analysis of the results of the experiments run using the matrix parameters listed in FIG. 10 were carried out using commercially available software. The analysis revealed the graphical data illustrated in FIG. 11A and FIG. 11B, which are half-normal plots of percentage along the Y-axis and the absolute standard effect of the parameters along the X-axis. The fitted line in each graph represents substantially zero statistical effect by a given parameter. In other words, if a data point falls on the line, the parameter that the data point represents has no influence on the results of the system 200. Data points deviating from the line are considered statistically significant in that the system parameters that such data points represent have a significant effect on the results of the system 200. FIG. 11A is a half-normal plot for material removal and FIG. 11B is a half-normal plot for surface roughness. With specific reference to FIG. 11A, one can see that parameters A (down force), C (platen speed), D (head speed), and F (polishing pad type) had significant effect on material removal, while the other parameters did not. With specific reference to FIG. 11B, one can see that parameters A (down force), B (slurry flow), C (platen speed), and (polishing pad type); in particular, A (down force), C (platen speed) and F (polishing pad type), had significant effect on surface roughness, while the other parameters did not.

From these experiments and statistical analyses, it has been discovered that material removal and surface roughness were strongly influenced by choice of polishing pad 204, level of polishing down force, and platen speed. Furthermore, it has been discovered that the choice of polishing pad 204 and the speed of the platen 202 interacted constructively, where the two responses of interest were concerned, but destructively in the case of polishing down force. This situation has led to compromises where down force is concerned and a cyclical, sequential approach to material removal to achieve the aforementioned re-use goals.

As it is desirable to employ only one polishing pad 204 during the entirety of the material removal and surface roughness processing in order to achieve a simple and efficient process, special consideration has been given to its properties. In general, polishing pads used in CMP processes are polymeric, but vary widely in such physical properties as hardness, compressibility, permeability, nap thickness, pore structure, surface contour, and rebound rate, leading to varying performance characteristics. The polishing pad 204 is a critical element in the present CMP embodiments because, by means of its pore structure, it acts as a conduit for the near simultaneous distribution of slurry chemicals and expulsion of resulting polishing by-products. The selection of polishing pad product for specific applications of CMP is therefore critical to the achievement of desired process ends.

Figure 9:
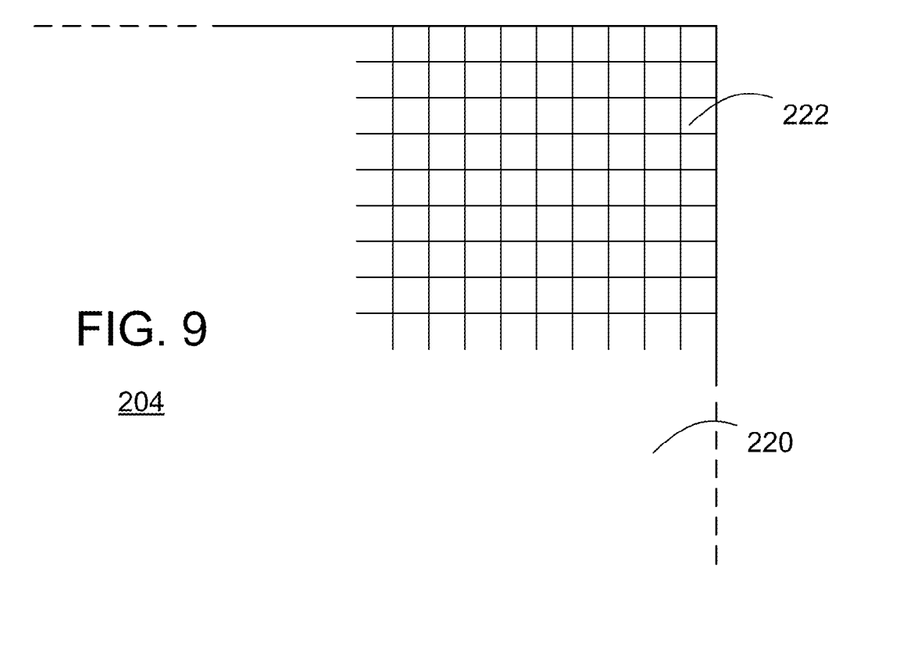
FIG. 9 is a schematic diagram showing some characteristics of a polishing pad suitable for use in the equipment of FIG. 7 and in connection with one or more embodiments described herein.

In view of the considerable experimentation and statistical analysis, it has been discovered that advantages may be achieved when the polishing pad 204 is of the felt-based, polyurethane impregnated type. The polishing pad 204 may be of about 1.25 mm nominal thickness, relatively low compressibility by pad standards (such as about 2.9% compressibility), considerable hardness (about 85 Asker C durometer), and low air permeability resistance. With reference to FIG. 9, the surface 220 of the polishing pad 204 that engages the donor semiconductor wafer 120 is preferably deeply grooved or channeled 222. By way of example, the grooves 222 may be in a perpendicular, cross-hatched arrangement in a Cartesian coordinate plane. It has been found that advantageous results may be obtained when the grooves 222 are about 1 mm or more deep and the cross-hatching is on the order of about 21 mm×21 mm. A suitable polishing pad 204 may be obtained from Rohm-Haas Incorporated, presently sold as SUBA 840 PAD 48"D PJ; XA25 (supplier material number 10346084). Alternative patterns for the groove 222 are possible, such as diamond-shaped grooves, spiral-shaped grooves, radially and/or circumferentially extending grooves, etc.

As for other processing parameters, the CMP process is conducted in sequential stages, where polishing down force, slurry concentration, and slurry particle size are strategically decremented in a sequence of steps executed on a single polishing pad 204 to remove damage and ion contamination born of implantation and exfoliation processes and restore the damaged, cleaved surface (and underlying layer) 121A of the donor semiconductor wafer 120. By using a single pad (or just 2 pads), the entire process can be automated providing significant reductions in cycle time and labor spent on changing pads compared to the multi-pad labor intensive conventional CMP processes.

One or more embodiments of the CMP process includes the primary steps of: (a) rotating the polishing pad 204 (via the platen 202), rotating the semiconductor donor wafer 120 (via the head 206), applying the polishing slurry to the polishing pad 204 (via the source 214), and pressing the semiconductor donor wafer 120 and the polishing pad 204 together; and (b) a rinsing step, where the polishing pad 204 and the semiconductor donor wafer 120 continue rotation and contact, but the application of the polishing slurry is discontinued in favor of applying a rinsing fluid to the polishing pad 204.

The CMP sequence may be initiated (a startup stage) by executing an initial "ramp-up" step (a) process, in which the polishing pad 204 and the semiconductor donor wafer 120 are each rotated (e.g., both clockwise), applying the polishing slurry to the polishing pad 204, and pressing the semiconductor donor wafer 120 and the polishing pad 204 together. During startup, the polishing pad 204 is wetted and saturated with a colloidal silica slurry with a mean particle size of about 60-80 nm (such as 70 nm), an overall dilution (as dispensed onto the pad 204) of about 30:1-50:1, such as about 40:1 in deionized water and chemical stabilizers, and a pH in the 8.0-9.0 range.

The flow rate of the slurry should be selected to accomplish the polishing objectives for the given parameters of the process and system 200. Such parameters include, for example, the size of the polishing platen 202, the size of the polishing pad 204, and/or the surface area of the cleaved surface 121A. Indeed, a relatively small diameter platen 202 and polishing pad 204, such as those found on laboratory-scale machines require far less slurry than relatively larger diameter platens 202 and polishing pads 204, typically associated with industrial-scale polishers. Further, the surface characteristics (e.g., the groove pattern, frequency, and groove depth) of the polishing pad 204 may significantly affect the minimum slurry flow rate. Indeed, deep and/or high concentrations of grooves in the polishing pad 204 tend to channel significantly more slurry away from the polishing zone as compared with shallow and/or low concentrations of grooves. As an alternative or addition to employing higher or lower flow rates of slurry, increasing or decreasing an additional, separate flow of deionized water may be employed. It is contemplated that the flow rate of the slurry should fall in the range of 250-2500 ml/min.

A suitable slurry product may be obtained from Nalco, part number 2360 colloidal silica polishing slurry. The platen 202 (and thus the polishing pad 204) rotational speed may be ramped to values of about 50-70 rpm, while the polishing head 206 (and thus the donor semiconductor wafer 120) rotational speed may be ramped to about 15-25 rpm. The down force (the pressure at which the semiconductor donor wafer 120 and the polishing pad 204 are pressed together) may be ramped to a moderate level of about 10-20 psi. The startup stage may last about 30 seconds.

The startup described above may transition seamlessly into a substantial or bulk material removal stage of considerable duration (e.g., about 200-300 seconds, or 200-600 seconds, such as about 240 seconds). For example, this may represent a "first" polishing step ($b_1$) conducted at the process settings described in the startup stage above. In this stage, exfoliation damage may be removed completely and a new surface established with improved roughness level. Alkaline components of the reactive slurry chemistry initially attack the cleaved surface of the donor semiconductor wafer 120, thereby breaking it down and forming hydrated silicate by-products. Polishing down force acts to press the wafer 120 uniformly against the conformal polishing pad 204, while mechanical action of the rotation acts with the slurry particles to remove polishing by-products and expose new semiconductor material for renewed chemical attack. This cycle repeats rapidly and continuously until desired amount of material removal is accomplished.

Intermediate studies conducted on this stage of the CMP indicate that a surface roughness of approximately 4.5 to 5 Å rms (as measured by AFM on a 5 μm×5 μm image area) is established under these polishing conditions. More chemically aggressive (high pH) silica slurries (both fumed and colloidal particle based) such as Nalco 2358 or Fujimi Planerlite 4219 have been successfully employed in the startup and first stages as well, with a reduced process time and somewhat reduced surface quality, e.g. a somewhat rougher surface. Thus, the bulk material removal may be performed faster with a more aggressive polishing, but this achieved at the cost of a reduced surface quality that may require a longer final smoothing or buffing operation.

In a next stage, a rinsing step (c) is conducted, where the polishing pad 204 and the semiconductor donor wafer 120 continue rotation and contact, but the application of the polishing slurry is discontinued in favor of applying deionized water to the polishing pad 204. The flow rate of the deionized water may be on the order of about 5600 ml/min. During this rinsing stage, the down force may be significantly reduced as compared with the prior polishing step ($b_1$). For example, the pressure at which the semiconductor donor wafer 120 and the polishing pad 204 are pressed together may be between about 1-3 pounds per square inch, which is about 70%-90% lower than during the earlier polishing step ($b_1$). The rotational speeds of the polishing pad 204 and the donor semiconductor wafer 120 may be maintained at about 50-70 rpm, and about 15-25 rpm, respectively. By way of example, this rinsing step (b) may be conducted for about 20-50 seconds, such as about 30 seconds.

In general, the CMP protocol calls for a polishing step ($b_1$) followed by a rinsing step (c) in sequence at least two times, where at least one of the following parameters are reduced in at least two successive intervals of polishing steps (b): (i) a pressure at which the semiconductor donor wafer 120 and the polishing pad 204 are pressed together, (ii) a mean particle size of an abrasive within the polishing slurry, and (iii) a concentration of the slurry in water and stabilizers. Preferably, all intervals of polishing steps (b) and rinsing steps (c) are carried out without changing the polishing pad 204.

By way of example, in a next or second stage, a smoothing operation may be conducted in which another (or "second") polishing step ($b_2$) is carried out. In this second polishing step ($b_2$), the down force is elevated as compared with the prior rinsing step (c), but the down force is reduced as compared with that of the first polishing step ($b_1$). For example, the pressure at which the semiconductor donor wafer 120 and the polishing pad 204 are pressed together may be reduced to about 5-15 pounds per square inch (such as 12 psi) during this second polishing step ($b_2$), which is about 25% lower as compared with the first polishing step ($b_1$). The rotational speeds of the polishing pad 204 and the donor semiconductor wafer 120 may be maintained at about 50-70 rpm, and about 15-25 rpm, respectively. In this smoothing polishing step, the same colloidal silica slurry (mean particle size of about 70 nm and about 40:1 overall dilution in deionized water and chemical stabilizers) may be employed. By way of example; this polishing step ($b_2$) may be conducted for about 150-220 seconds, such as about 180 seconds. The reduction in polishing down force improves surface roughness. Intermediate studies conducted on this smoothing polishing step indicate that a surface roughness of approximately 3.6 to 4.0 Å (as measured by AFM on a 5 µm×5 µm image area) is established.

In a next stage, another rinsing step (c), substantially similar to the earlier rinsing step may be conducted. The polishing pad 204 and the semiconductor donor wafer 120 continue rotation and contact, and application of the deionized water to the polishing pad 204 is conducted. The same, reduced down force of about 1-3 psi may be employed as compared with the prior, second polishing step ($b_2$). By way of example, this rinsing step (c) may also be conducted for about 30 seconds.

In a next stage, a final or "buff" polishing operation may be conducted in which another (or "third") polishing step ($b_3$) is carried out. The down force is elevated as compared with the prior rinsing step (c), but the down force is reduced as compared with those of both the first and second polishing steps ($b_1$) and ($b_2$). For example, the pressure at which the semiconductor donor wafer 120 and the polishing pad 204 are pressed together may be reduced to about 1-5 pounds per square inch (such as 3 psi) during this third, polishing step ($b_3$), which is about 65-85% lower as compared with the second polishing step ($b_2$). The rotational speeds of the polishing pad 204 and the donor semiconductor wafer 120 may be maintained at about 50-70 rpm, and about 15-25 rpm, respectively. In this buff step, a substantially reduced particle size of the colloidal silica slurry is employed as compared with the first and/or second polishing steps ($b_1$) and ($b_2$). For example, a mean particle size of between about 30-40 nm (such as about 35 nm) is employed, which is between about 40%-60% smaller as compared with the earlier polishing steps ($b_1$) and ($b_2$). By way of example, a suitable slurry product may be obtained from Fujimi Corporation, namely Glanzox 3950 (a finishing slurry product containing 4.5% by weight high purity colloidal silica of 35 nm average particle size). In addition, a substantially reduced concentration of the colloidal silica slurry is employed as compared with the first and/or second polishing steps ($b_1$) and ($b_2$). For example, the concentration may be on the order of between about 600:1-1000:1 overall dilution in deionized water and chemical stabilizers, which is between about 1000%-3000% lower as compared with at least one of the earlier polishing steps ($b_1$) or ($b_2$). By way of example, this buff polishing step ($b_3$) may be conducted for about 150-220 seconds, such as about 180 seconds. Intermediate studies conducted on this process step indicate that a surface roughness approaching 3.0 Å rms, such as between 3.3 to 3.5 Å (as measured by AFM on a 5 µm×5 µm image area) is established under these polishing conditions.

In a next stage, another rinsing step (c), substantially similar to the earlier rinsing steps may be conducted to cleanse the polishing surfaces (both pad 204 and wafer 120) of slurry components employed in the preceding steps.

Optional additional processing stages may be employed to further improve the result. For example, another interval of rinsing step (c) may be conducted, where: (i) the interval lasts between about 50-70 seconds (such as 60 seconds), (ii) the pressure at which the semiconductor donor wafer 120 and the polishing pad 204 are pressed together is between about 1-3 pounds per square inch, (iii) speeds of rotation of the polishing pad 204 and the semiconductor donor wafer 120 are between about 25-45 rpm (such as 35 rpm), and (iv) the rinsing fluid is a rinsing agent. The rinsing agent may include a secondary chemistry (e.g., lower pH—typically neutral but acidic chemistry may also be employed), including chemical components that act to reduce surface tension between the wafer 120 and the polishing pad 204. This chemistry passivates the wafer 120, creating a hydrophylic surface conducive to downstream cleaning. By way of example, a Rodelene rinse agent composed of silica, isopropyl alcohol, and ethylene glycol in deionized water manufactured by Rohm-Haas Electronic Materials CMP Incorporated may be employed.

A final rinsing step (c) may be conducted, where: (i) the interval lasts between about 5-20 seconds, (ii) the pressure at which the semiconductor donor wafer 120 and the polishing pad 204 are pressed together is minimized, (iii) speeds of rotation of the polishing pad 204 and the semiconductor donor wafer 120 are between about 25-45 rpm, and (iv) the rinsing fluid is water.

Figure 12A:
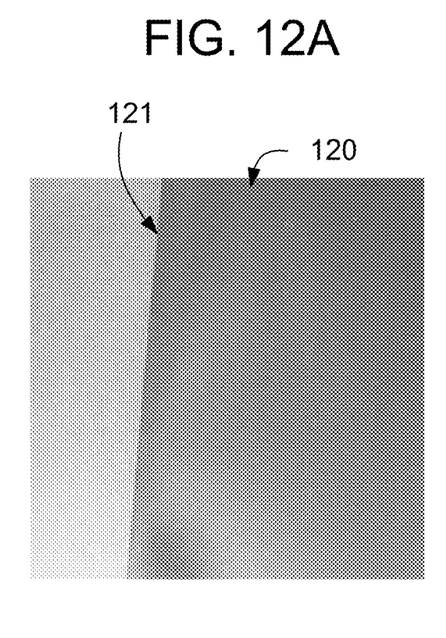
FIG. 12A illustrates the lack of damage of the surface of the donor semiconductor wafer that has been subjected to a CMP re-use process in accordance with one or more embodiments described herein.
Figure 12B:
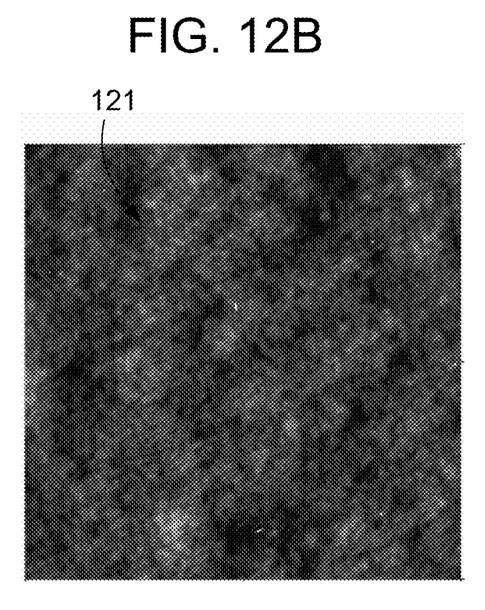
FIG. 12B illustrates the surface roughness and morphology characteristics of a surface of a donor semiconductor wafer that has been subjected to a CMP re-use process in accordance with one or more embodiments described herein.
Figure 12C:
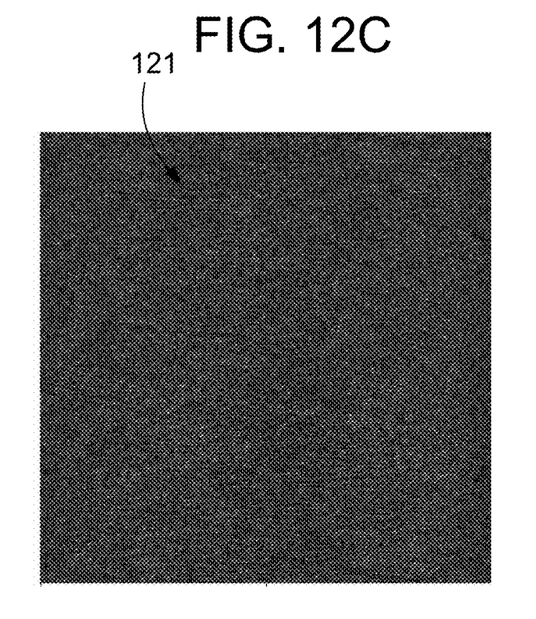
FIG. 12C illustrates the surface roughness and morphology characteristics of a surface of a pristine donor semiconductor wafer, not yet having been subject to ion implantation/exfoliation.
Figure 12D:
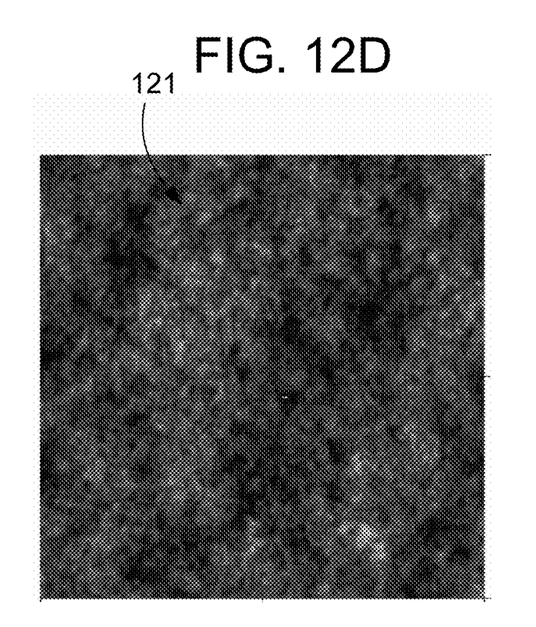
FIG. 12D illustrates the surface roughness and morphology characteristics of a surface of a prime donor semiconductor wafer that has been subjected to a CMP re-use process in accordance with one or more embodiments described herein.

With reference to FIGS. 12A, 12B, 12C, and 12D results of the aforementioned CMP processes were observed. FIG. 12A illustrates the lack of damage of the donor surface 121 of an implanted and exfoliated donor semiconductor wafer 120 that has been subjected to the CMP refresh processes described herein. FIG. 12B illustrates the surface roughness and morphology characteristics of a surface 121 (measured by AFM on a 5 µm×5 µm image area) of a donor semiconductor wafer 120 that has been subjected to exfoliation followed by the CMP re-use processes described herein. FIG. 12C illustrates the surface roughness and morphology characteristics of a surface 121 (measured by AFM on a 5 µm×5 µm image area) of a pristine donor semiconductor wafer 120, not yet having been subject to ion implantation/exfoliation. FIG. 12D illustrates the surface roughness and morphology characteristics of a surface 121 (measured by AFM on a 5 µm×5 µm image area) of a prime donor semiconductor wafer that has not been subjected to exfoliation, but has been subjected to a CMP re-use process in accordance with one or more embodiments described herein. A comparison of (i) the donor semiconductor wafer 120 that has been subjected to exfoliation followed by the CMP refresh processes described herein (FIG. 12B), with (ii) a prime donor semiconductor wafer 120 that has not been subjected to exfoliation, but has been subjected to a CMP refresh processes described herein (FIG. 12D), reveals that the respective surfaces 121 have nearly identical surface roughness and morphology. The embodiments described herein were observed to fully restore semiconductor wafer 120 surface roughness and morphology to levels suitable for renewed exfoliation.

It has been demonstrated that further surface roughness improvement, including complete restoration of a previously exfoliated surface to a prime surface, is readily attained when the embodiments described in this invention are applied using a finishing pad. Indeed, AFM rms surface roughness measurements below 1 Å have been achieved using the aforementioned embodiments with a Fujimi SSW1 finish polishing pad, sequential slurry combination Nalco 2358 (70 nm particle size) followed by rinsing and the application of Glanzox 3950 (35 nm particle size).

Although the embodiments herein have been described with reference to particular characteristics and instrumentalities, it is to be understood that these embodiments are merely illustrative of desirable principles and applications. It is therefore to be understood that numerous modifications may be made to the illustrative embodiments and that other arrangements may be devised without departing from the spirit and scope of the present invention as defined by the appended claims.

The invention claimed is:

1. A method of reducing surface damage of a semiconductor donor wafer, comprising the steps of:
    (a) rotating a polishing pad, rotating the semiconductor donor wafer, applying a polishing slurry to the polishing pad, and pressing the semiconductor donor wafer and the polishing pad together; and (b) rotating the polishing pad and the semiconductor donor wafer, discontinuing the application of the polishing slurry, applying a rinsing fluid to the polishing pad, and pressing the semiconductor donor wafer and the polishing pad together, wherein step (a) followed by step (b) is carried out in sequence at least two times, and at least one of the following are reduced in at least two successive intervals of step (a):
  (i) a pressure at which the semiconductor donor water and the polishing pad are pressed together,
  (ii) a mean particle size of an abrasive within the polishing slurry, and
  (iii) a concentration of the polishing slurry by using the slurry diluted with water;

wherein the method comprises in sequence:

a first interval of step (a), where: (i) the interval lasts between about 200-600 seconds, (ii) the pressure at which the semiconductor donor wafer and the polishing pad are pressed together is between about 10-20 pounds per square inch, (iii) the mean particle size of the slurry is between about 60-80 nm, and (iv) the concentration of the slurry is between about 30:1-50:1;

a first interval of step (b), where: (i) the interval lasts between about 20-50 seconds, and (ii) the pressure at which the semiconductor donor wafer and the polishing pad are pressed together is between about 1-3 pounds per square inch;

a second interval of step (a), where: (i) the interval lasts between about 150-220 seconds, (ii) the pressure at which the semiconductor donor wafer and the polishing pad are pressed together is between about 10-15 pounds per square inch, (iii) the mean particle size of the slurry is between about 60-80 nm, and (iv) the concentration of the slurry is between about 30:1-50:1;

a second interval of step (b), where: (i) the interval lasts between about 20-50 seconds, and (ii) the pressure at which the semiconductor donor wafer and the polishing pad are pressed together is between about 1-3 pounds per square inch;

a third interval of step (a), where: (i) the interval lasts between about 200-600 seconds, (ii) the pressure at which the semiconductor donor wafer and the polishing pad are pressed together is between about 2-5 pounds per square inch, (iii) the mean particle size of the slurry is between about 30-40 nm, and (iv) the concentration of the slurry is between about 600:1-1000:1; and a third interval of step (b), where: (i) the interval lasts between about 10-20 seconds, and (ii) the pressure at which the semiconductor donor wafer and the polishing pad are pressed together is between about 1-3 pounds per square inch.

2. The method of claim 1, wherein:
all intervals of steps (a) and (b) are carried out without changing the polishing pad; and
the pressure at which the semiconductor donor wafer and the polishing pad are pressed together is at least about 25% lower during a second interval of step (a) as compared with a first, earlier interval of step (a).

3. The method of claim 1, wherein the the pressure at which the semiconductor donor wafer and the polishing pad are pressed together is between about 65-85% lower during a third interval of step (a) as compared with the second, earlier interval of step (a).

4. The method of claim 1, wherein the pressure at which the semiconductor donor wafer and the polishing pad are pressed together is at least about 70%-90% lower during a subsequent interval of step (b) as compared with an earlier interval of step (a).

5. The method of claim 1, wherein:
all intervals of steps (a) and (b) are carried out without changing the polishing pad; and
the mean particle size of the slurry is between about 40%-60% smaller during a subsequent interval of step (a) as compared with an earlier interval of step (a).

6. The method of claim 5, wherein:
the mean particle size of the slurry is about the same during a first interval of step (a) and a second, subsequent interval of step (a); and
the mean particle size of the slurry is about 40%-60% smaller during a third, subsequent interval of step (a).

7. The method of claim 1, wherein:
all intervals of steps (a) and (b) are carried out without changing the polishing pad; and
the concentration of the slurry is between about 1000%-3000% lower during a subsequent interval of step (a) as compared with an earlier interval of step (a).

8. The method of claim 7, wherein:
the concentration of the slurry is about the same during a first interval of step (a) and a second, subsequent interval of step (a); and
the concentration of the slurry is about 1000%-3000% lower during a third, subsequent interval of step (a).

9. The method of claim 1, wherein a speed of rotation of the polishing pad is between about 40-80 rpm, and a speed of rotation of the semiconductor donor wafer is between about 10-30 rpm.

10. The method of claim 1, further comprising in sequence:
a fourth interval of step (b), where: (i) the interval lasts between about 50-70 seconds, (ii) the pressure at which the semiconductor donor wafer and the polishing pad are pressed together is between about 1-3 pounds per square inch, (iii) speeds of rotation of the polishing pad and the semiconductor donor wafer are between about 25-45 rpm., and (iv) the rinsing fluid is a rinsing agent; and
a fifth interval of step (b), where: (i) the interval lasts between about 5-20 seconds, (ii) the pressure at which the semiconductor donor wafer and the polishing pad are pressed together is less than about 1-3 pounds per square inch, (iii) speeds of rotation of the polishing pad and the semiconductor donor wafer are between about 25-45 rpm., and (iv) the rinsing fluid is water.

11. The method of claim 1, wherein the surface damage of a semiconductor donor wafer results from subjecting an ion implantation surface thereof to ion implantation, bonding to a substrate, and exfoliation to expose a cleaved surface of the donor semiconductor wafer, which is the damaged surface.

12. The method of claim 11, wherein the semiconductor donor wafer is of rectangular cross-section.

13. The method of claim 1, wherein the donor semiconductor wafer is a single crystal semiconductor wafer.

14. The method of claim 13, wherein the donor semiconductor wafer is taken from the group consisting of: silicon (Si), germanium-doped silicon (SiGe), silicon carbide (SiC), germanium (Ge), gallium arsenide (GaAs), GaP, and InP.

* * * * *